United States Patent

Koyama et al.

Patent Number: 5,227,681
Date of Patent: Jul. 13, 1993

[54] INTEGRATION CIRCUIT

[75] Inventors: Mikio Koyama; Hiroshi Tanimoto, both of Kawasaki, Japan

[73] Assignee: Kabushiki Kaisha Toshiba, Kawasaki, Japan

[21] Appl. No.: 715,772

[22] Filed: Jun. 14, 1991

[30] Foreign Application Priority Data

Jun. 15, 1990 [JP] Japan .................. 2-155514
Mar. 26, 1991 [JP] Japan .................. 3-61664

[51] Int. Cl.$^5$ .............................. H03F 3/45
[52] U.S. Cl. ...................... 307/494; 330/300; 307/497
[58] Field of Search ............. 307/494, 497; 330/252, 330/254, 253, 261, 277, 300, 306

[56] References Cited

U.S. PATENT DOCUMENTS 4,904,952  2/1990  Tanimoto ..................... 330/252
5,017,805  5/1991  Kase ........................ 307/494 X

FOREIGN PATENT DOCUMENTS 58-161413  9/1983  Japan .
63-178611  7/1988  Japan .

OTHER PUBLICATIONS

Proceedings of the International Symposium on Circuits and Systems, vol. 22, No. 1/3, 1989, IEEE, pp. 100–105, F. Krummenacher, "Design Considerations in High-Frequency CMOS Transductance Amplifier Capacitor Filters".

MOS Transconductors and Integrators with High Linearity, IEE Electronics Letters, 27, Feb. 1986, vol. 22, No. 5, pp. 245–246.

Primary Examiner—Steven Mottola
Attorney, Agent, or Firm—Oblon, Spivak, McClelland, Maier & Neustadt

[57] ABSTRACT

An integration circuit includes a differential amplifier constituted by at least two bipolar transistors serving as amplifying elements, a capacitor connected, as a load, to the differential amplifier, and a field-effect transistor having source and drain electrodes connected between the emitter electrodes of the two bipolar transistors. A control voltage is applied to the gate electrode of the field-effect transistor.

14 Claims, 14 Drawing Sheets

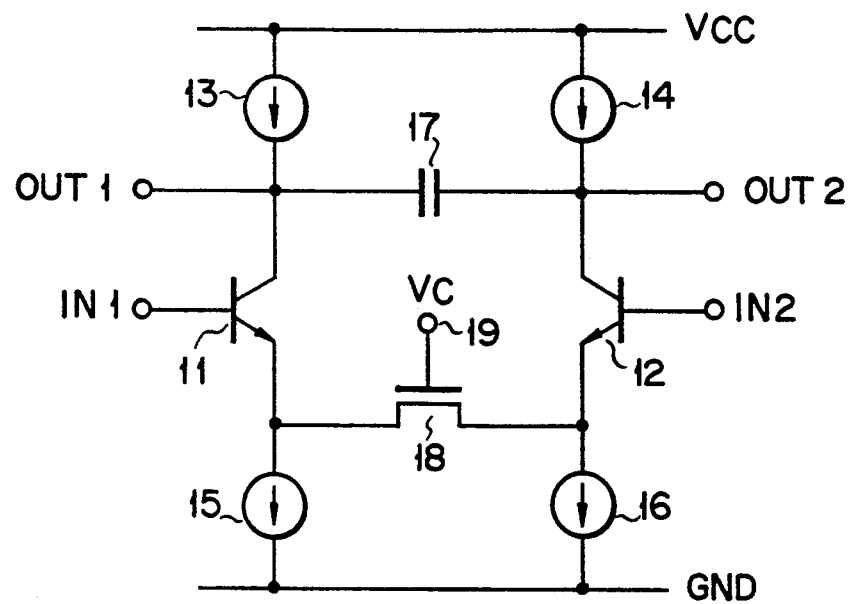
F I G. 1
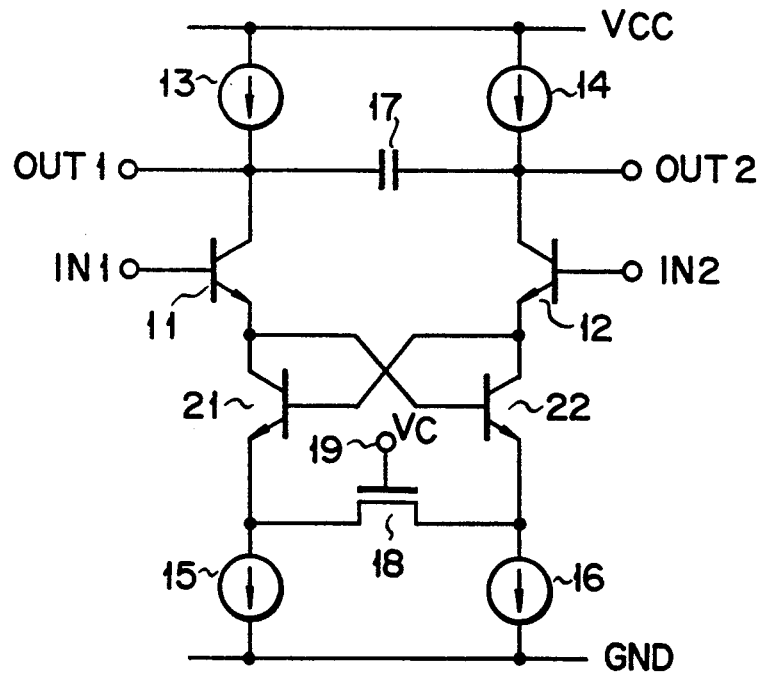
F I G. 2

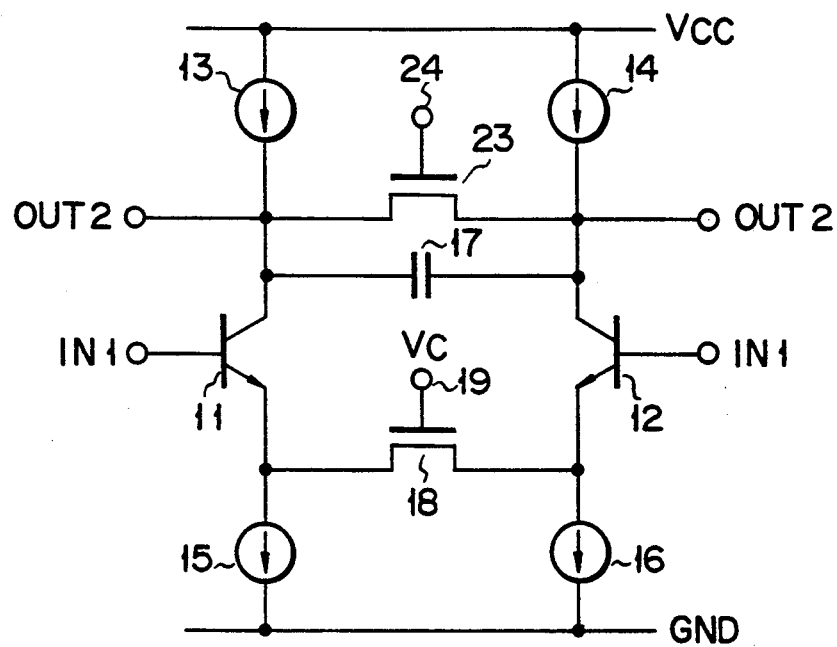
F I G. 3
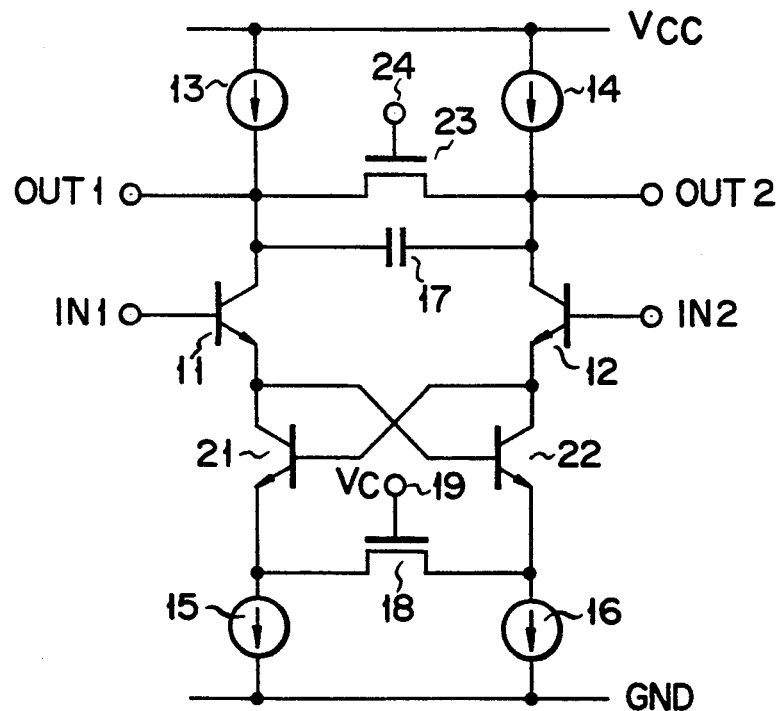
F I G. 4

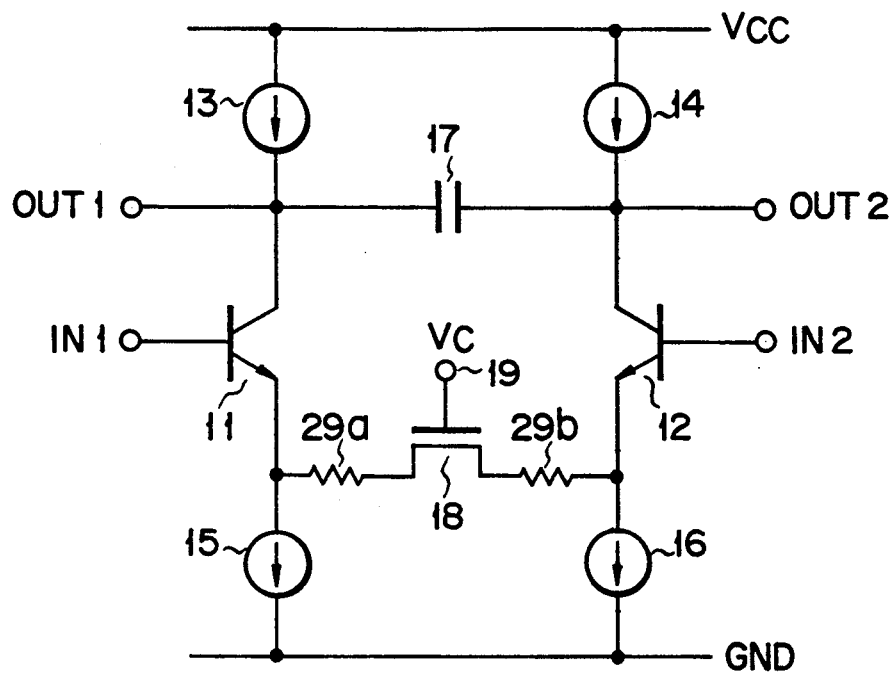
F I G. 5
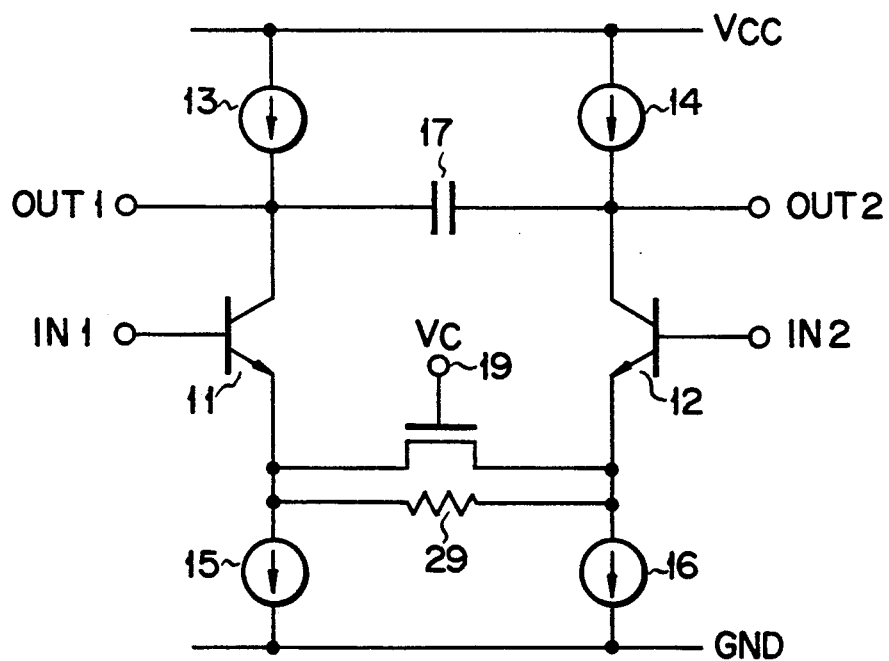
F I G. 6

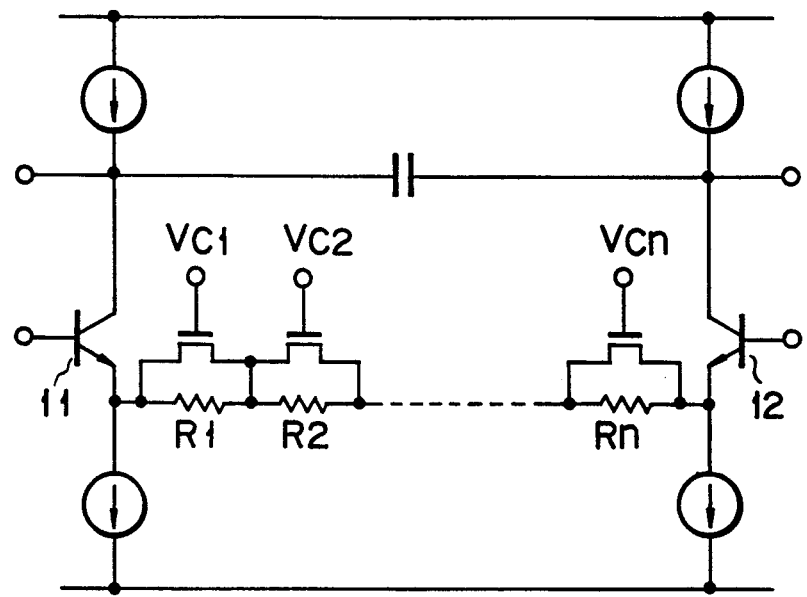
F I G. 9
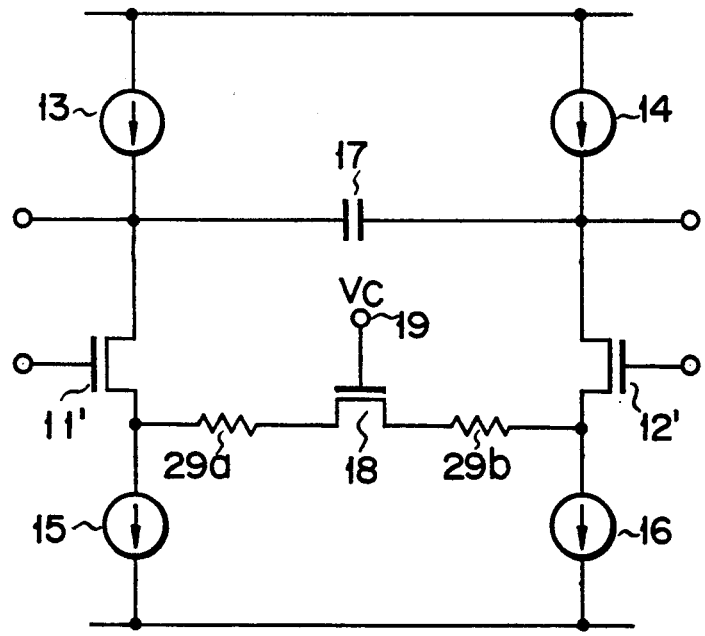
F I G. 10

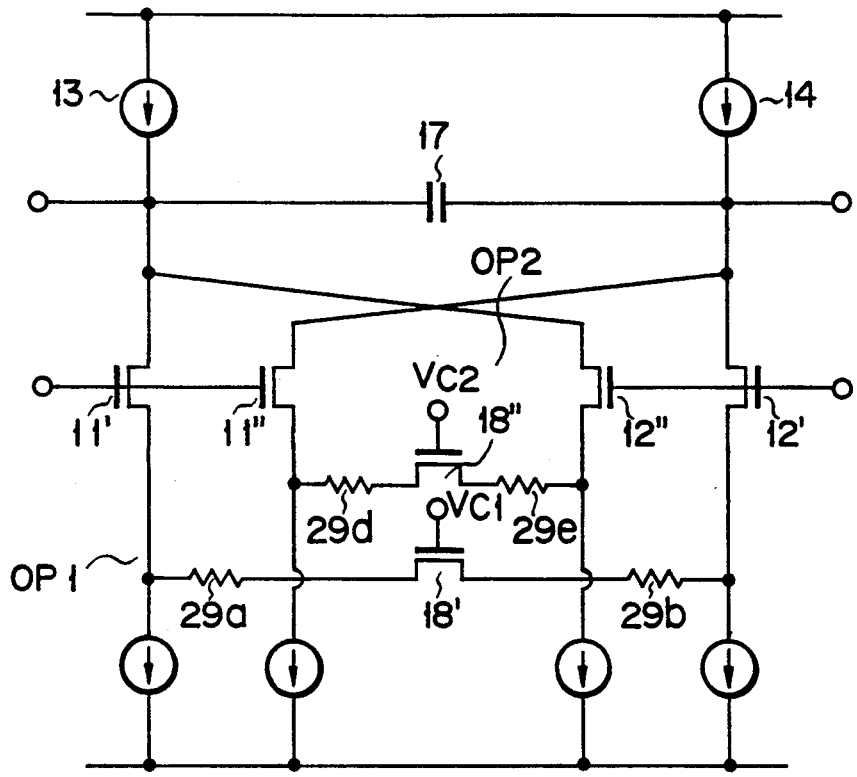
F I G. 11
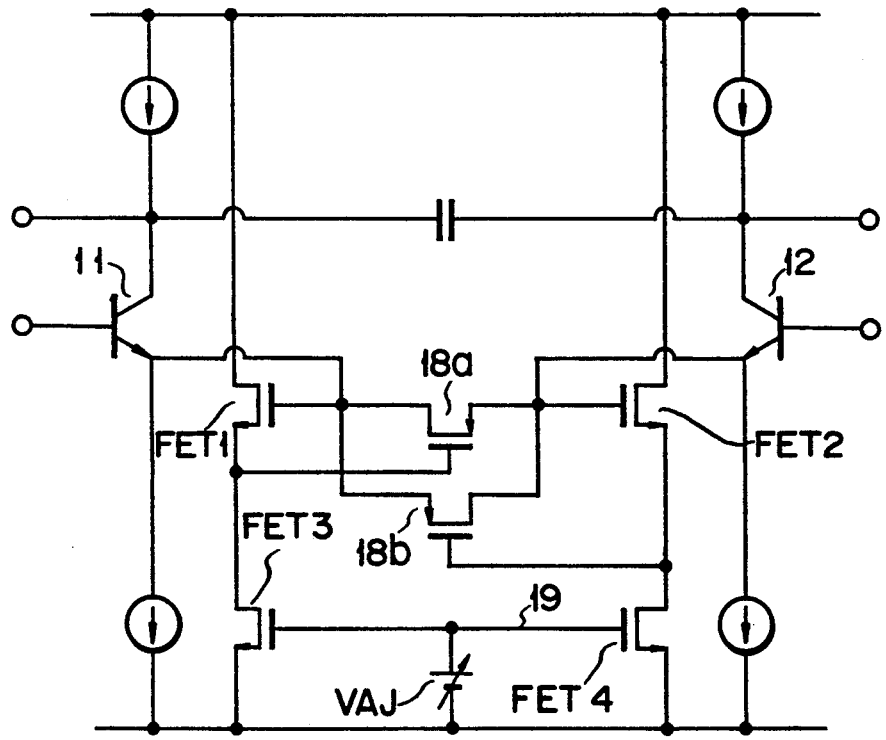
F I G. 12

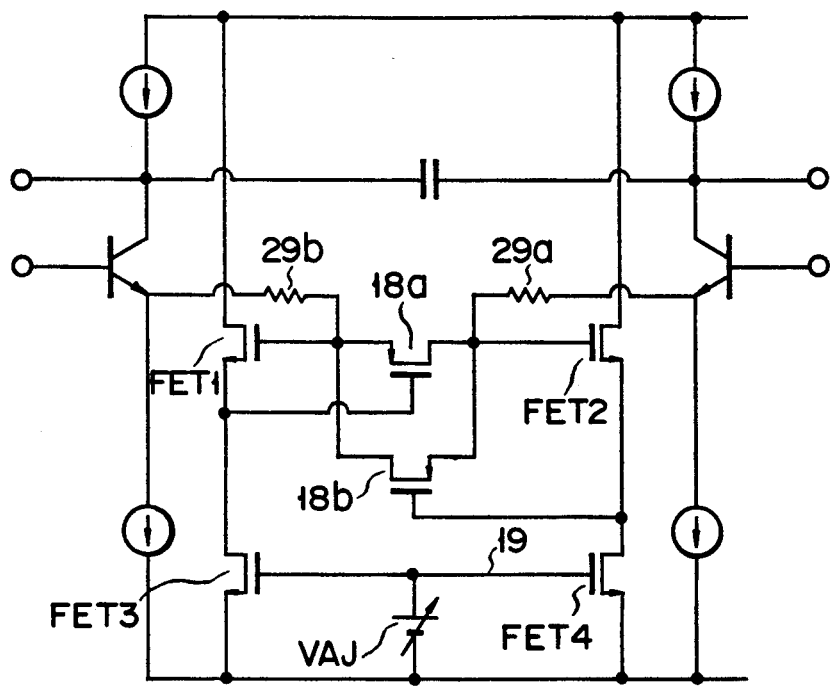
F I G. 13
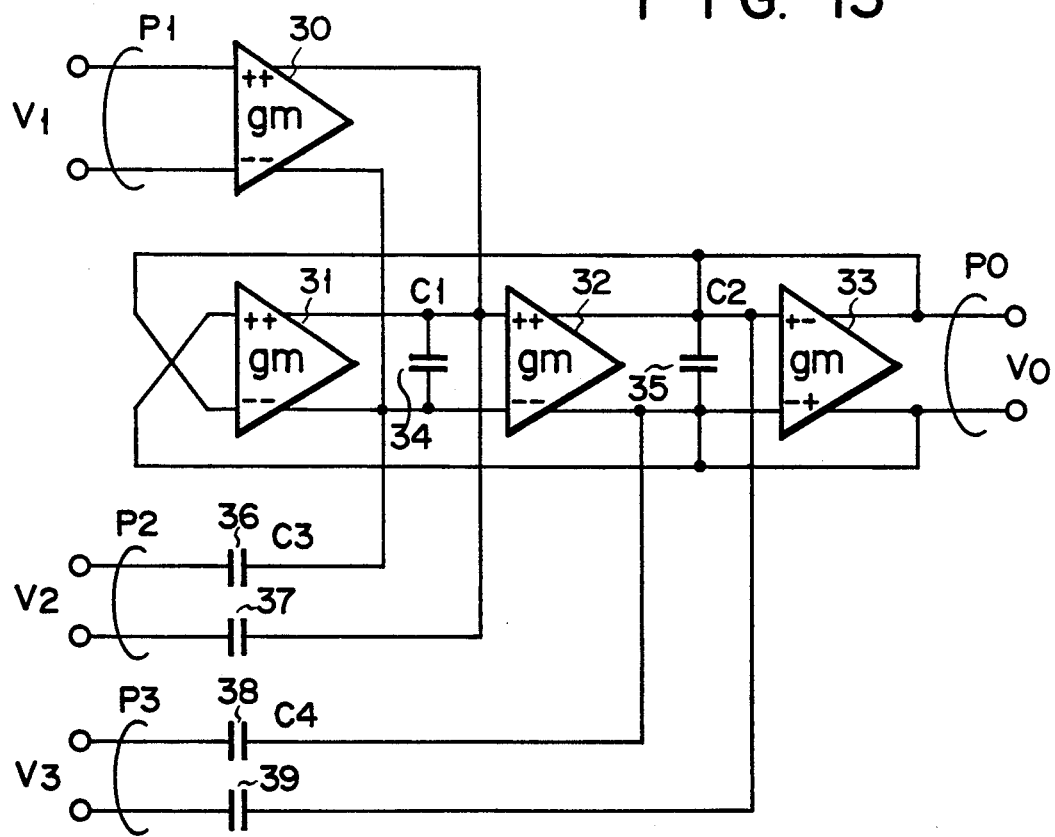
F I G. 14

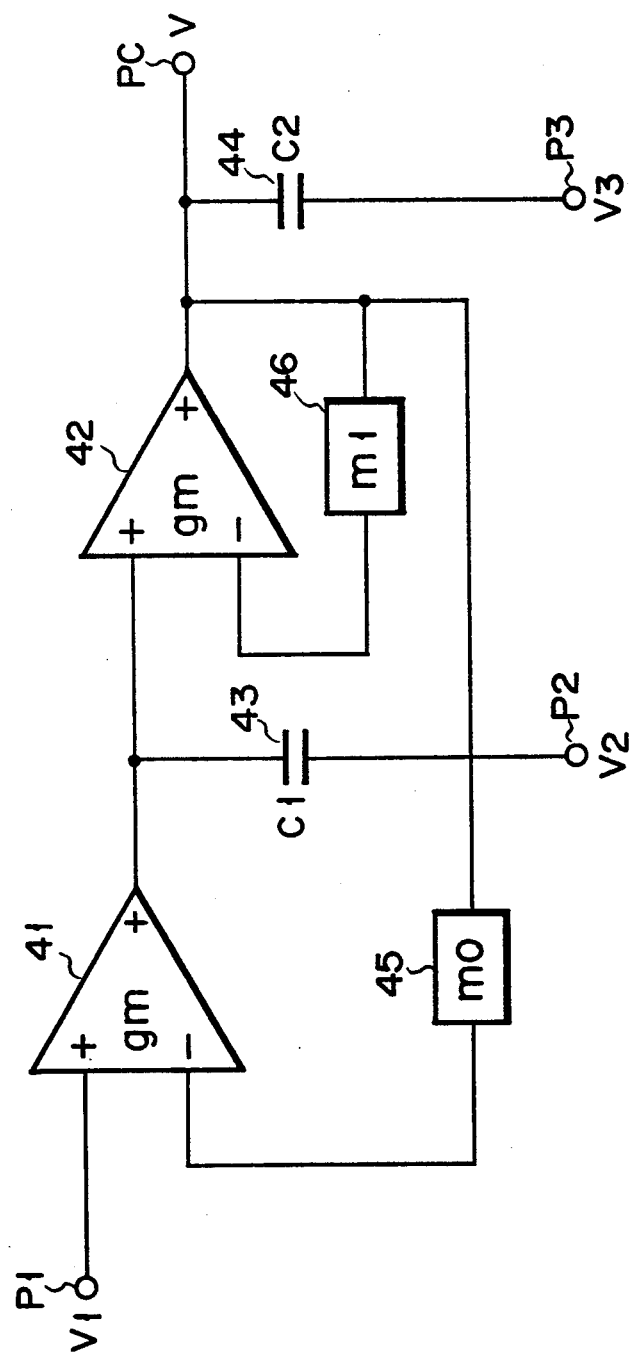
F I G. 17

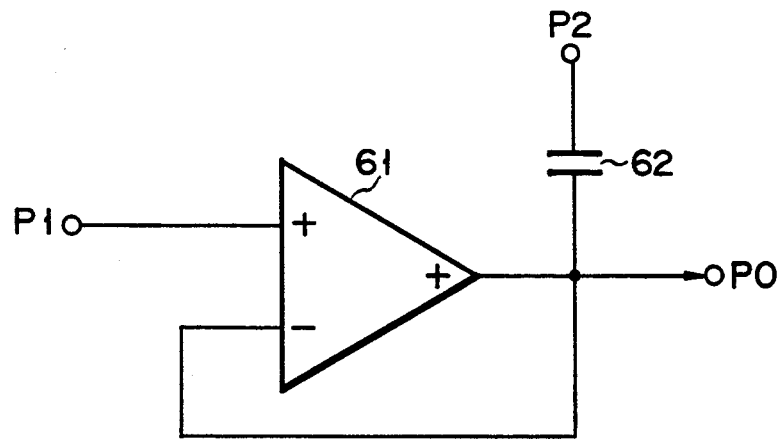
F I G. 19
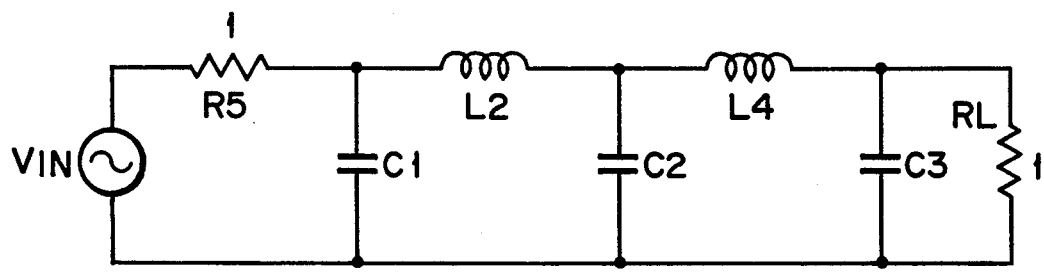
F I G. 20

INTEGRATION CIRCUIT

BACKGROUND OF THE INVENTION

1. Field of the Invention

The present invention relates to an integration circuit and, more particularly, to an integration circuit having a variable time constant, which is applied to an active filter and the like.

2. Description of the Related Art

Recently, active filters have been formed into high-frequency ICs. Attempts have been made to integrate an active filter having a video frequency (several MHz) used for video devices such as a VTR and a TV receiver into an IC together with a capacitor. If the frequency of an active filter is further increased, it is expected that a high-precision low-pass filter having a frequency of 20 MHz to 35 MHz used for a high quality television, and a high-Q band-pass filter which is operated at a frequency of several tens MHz and used in the field of communication can be realized.

If an active filter having a frequency band above several MHz is realized by an operational amplifier type filter constituted by two amplifying stages, good frequency characteristics are difficult to obtain due to a need for phase compensation. For this reason, when an active filter having a high frequency band is to be realized, an integration circuit constituted by a differential amplifier having a capacitor as a load is used. An integration circuit constituting an active filter must satisfy the following requirements:

a. it has a variable time constant so as to allow correction of variations in capacitance value of a capacitor integrated in an IC;

b. it has a high S/N ratio when an active filter is formed; and c. it has a small distortion factor.

The performance required for the integration circuit to satisfy the requirement b will be described below.

The S/N ratio of the filter is defined as the ratio of the input level range (Vr) of the differential amplifier constituting the integration circuit to a square root $\sqrt{(\overline{\text{Vout}^2})}$ of the square average of output noise voltage outputs from the filter, as indicated by equation (1):

$$S/N = \frac{Vr}{\sqrt{(\overline{\text{Vout}^2})}} \quad (1)$$

According to the analysis result described in reference 1: "High frequency CMOS continous-time filters", the output noise voltage $\sqrt{/(\overline{\text{Vout}^2})}$ is proportional to the square average of equivalent input noise voltages Vin, the filter Q, and a center frequency fo and is given by equation (2) below for a quadratic filter:

$$\overline{\text{Vout}^2} = \frac{\overline{\text{Vin}^2}}{\Delta f} Q \cdot fo \cdot \pi \quad (2)$$

where Δf is the bandwidth.

According to equations (1) and (2), it is apparent that the S/N ratio of an active filter can be increased by using an integration circuit having a large ratio of the input level range Vr to the equivalent input noise voltage Vin.

An integration circuit constituted by a gain cell is widely used as a conventional integration circuit for an active filter. For example, this integration circuit is used for a multipurpose filter disclosed in reference: Published Unexamined Japanese Patent Application No. 58-161413. When the product of a transconductance gm of a transistor Q3 and an emitter degeneration resistance $R_E$ is sufficiently larger than 1 (gm·$R_E$>>1) due to the local feedback by the emitter degeneration resistance $R_E$, the nonlinearity of a differential amplifier constituted by transistors Q1 and Q2 is improved to have linear I/O characteristics. Furthermore, an input level range as large as gm·$R_E$ times that of a circuit without the emitter degeneration resistance $R_E$ (100 mVpp×gm RE) can be obtained.

A transconductance Gm of the gain cell is the product of the reciprocal of the emitter degeneration resistance $R_E$ and the ratio of a current I1 to a current I2, i.e., (1/$R_E$)(I1/I2). An integration circuit used for an active filter is required to have a variable time constant to change the characteristics (mainly, a cutoff frequency or a center frequency) of the filter.

In the conventional integration circuit, an output from the differential amplifier is logarithmically compressed by a transistor Q5 and is subsequently expanded by the transistor Q3 to extract an output signal Vout. In addition, the total transconductance can be changed by changing the value of the current I2 or I1, thus changing the time constant. In this integration circuit, therefore, noise is amplified in the process of compression/expansion, and the square average Vint2 of the equivalent input noise voltages is given by equation (3) below, assuming that I1=I2, and that integration circuit is driven by a circuit having a low output impedance for the sake of simple explanation. In this case, shot noise generated by the base current is too small to be considered.

$$\frac{\overline{\text{Vint}^2}}{\Delta f \cdot 2 \cdot 4kT} = R_B(2n^2 + 1) + \frac{(2n + 2)}{2Gm} \quad (3)$$

for n=gm·$R_E$, where k is a Boltzmann's constant, T is the absolute temperature, $R_B$ is the base resistance of a transistor, and Gm is the transconductance of a gain cell. For the sake of comparison, an equivalent input noise voltage $\overline{\text{Vint}'^2}$ of the most basic differential amplifier without the emitter degeneration resistance $R_E$ is given by equation (4):

$$\frac{\overline{\text{Vint}^2}}{\Delta f \cdot 2 \cdot 4kT} = R_B + \frac{(2n + 2)}{2gm'} \quad (4)$$

where gm' is the transconductance of a transistor.

In this case, assuming that the two types of transconductances Gm and gm' are equal in value, it is found from the comparison between equations (3) and (4) that thermal noise due to the base resistance $R_B$ and the shot noise are increased $\sqrt{2}$·n times and $\sqrt{(2n+2)}$ times, respectively, in terms of voltage value. Since the noise is increased with the expansion of the input level range, an increase in S/N ratio cannot be expected much.

According to an integration circuit disclosed in reference: "Gyrator Video Filter IC with Automatic Tuning", IEEE JOURNAL OF SOLID-STATE CIRCUITS, VOL SC-15, DECEMBER, 1980, pp. 965, FIG. 7, 1980, only the linearity is improved by the emitter degeneration resistance $R_E$, and noise is not amplified because logarithmic compression/expansion is not performed as in the gain cell in the conventional filter. The square average $\overline{\text{Vint}^2}$ of the equivalent input noise voltages of this circuit is given by the following equation, provided that the transconductance of the latter conventional circuit is represented by Gm':

$$\frac{\overline{V_{int}^2}}{\Delta f \cdot 2 \cdot 4kT} = \frac{(\frac{1}{4}n + 1)}{2Gm'} \quad (5)$$

The noise output from the circuit is very small as compared with the gain cell, and the noise is not increased with the expansion of the input level range (n→large).

In the latter conventional integration circuit, even if, for example, the value of the current $I_1$ is changed, the transconductance Gm' does not change. For this reason, as shown in FIG. 7, the time constant of the integration circuit must be controlled by using a varactor diode as a load capacitance and changing a bias voltage $V_B$ to change the capacitance. With this arrangement, however, since the load capacitance is changed by an input signal, distortion is inevitably caused. In addition, since the capacitance variable range of a varactor diode is generally difficult to widen, the variable range of the time constant of the integration circuit is narrow. If, therefore, an active filter is constituted by this integration circuit, variations in cutoff frequency cannot often be corrected to obtain a desired frequency. If the capacitance variable range of the varactor diode is widened, the distortion based on variations in load capacitance of an input signal is increased.

As described above, in the integration circuit constituted by the conventional gain cell, the time constant can be easily changed over a wide range by changing the transconductance of the differential amplifier, but noise is amplified. In the integration circuit whose time constant is changed by the varactor diode, the variable range of time constants is narrow, and distortion is increased with the expansion of the variable range.

SUMMARY OF THE INVENTION

It is an object of the present invention to provide an integration circuit in which a time constant can be changed by changing a transconductance over a wide range without increasing distortion, and noise is not amplified.

According to the present invention, there is provided an integration circuit having a capacitor as a load connected to a differential amplifier constituted by at least two bipolar transistors as amplifying elements, wherein the source and drain electrodes of a field-effect transistor are connected between the emitter electrodes of the two bipolar transistors, and the gate electrode of the field-effect transistor is connected to a control terminal.

The differential amplifier may include first to fourth bipolar transistors as amplifying elements. The base electrodes of the first and second bipolar transistors serve as input terminals, and the collector electrode of at least one of the first and second bipolar transistors serves as an output terminal. The collector and base electrodes of the third bipolar transistor are respectively connected to the emitter electrodes of the first and second bipolar transistors. The collector and base electrodes of the fourth bipolar transistor are respectively connected to the emitter electrodes of the second and first bipolar transistors. In this case, similar to the above circuit, a capacitor as a load is connected to the differential amplifier to constitute an integration circuit. The source and drain electrodes of a field-effect transistor are connected between the emitter electrodes of the third and fourth bipolar transistors, while the gate electrode of the field-effect transistor is connected to a control terminal.

In the integration circuit of the present invention, by changing the resistance value between the source and drain electrodes of the newly arranged field-effect transistor (to be referred to as an FET hereinafter) using a gate voltage, the transconductance of the differential amplifier is changed over a wide range, similar to the integration circuit based on the gain cell. As a result, the time constant of the integration circuit is changed. If this integration circuit is used for an active filter, for example, the cutoff frequency can be changed by changing the time constant of the integration circuit.

Of the noise produced by an FET, 1/f noise cannot be neglected at low frequencies. Assuming, however, that the integration circuit of the present invention is applied to a filter used at a frequency of several MHz, i.e., in a video frequency band, thermal noise corresponding to the resistance value between the source and drain electrodes of the FET is dominant noise. Therefore, square average $\overline{V_{int}'^2}$ of equivalent input noise voltages of the integration circuit of the present invention is substantially the same as that of the conventional integration circuit having no noise amplifying effect, and this integration circuit produces very low noise compared with the integration circuit based on the gain cell.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing an integration circuit according to an embodiment of the present invention;

FIG. 2 is a circuit diagram showing an integration circuit in which the emitters of bipolar transistors constituting a differential amplifier are connected to each other through a field-effect transistor;

FIG. 3 is a circuit diagram showing an integration circuit to which a positive feedback circuit is added;

FIG. 4 is a circuit diagram showing an integration circuit using DC gain control;

FIG. 5 is a circuit diagram showing an integration circuit constituted by a combination of the circuits shown in FIGS. 2 and 3;

FIG. 6 is a circuit diagram showing an integration circuit in which the resistance value between the emitters of bipolar transistors has a predetermined upper limit;

FIG. 9 is a circuit diagram showing an integration circuit to be operated under digital control;

FIG. 10 is a circuit diagram showing an integration circuit having improved nonlinearity characteristics;

FIG. 11 is a circuit diagram showing an integration circuit having improved nonlinearity characteristics according to another embodiment of the present invention;

FIG. 12 is a circuit diagram showing an integration circuit in which the nonlinearity characteristics of a field-effect transistor for connecting the emitters of bipolar transistors to each other are improved;

FIG. 13 is a circuit diagram showing an integration circuit as a modification of the circuit shown in FIG. 12;

FIG. 14 is a circuit diagram showing an active filter using the integration circuit of the present invention;

FIG. 17 is a circuit diagram showing another active filter using an integration circuit of the present invention;

FIG. 19 is a circuit diagram showing still another active filter using the integration circuit of the present invention;

FIG. 20 is a circuit diagram showing a lattice type quintic low-pass filter;

DETAILED DESCRIPTION OF THE PREFERRED EMBODIMENTS

Figure 7:
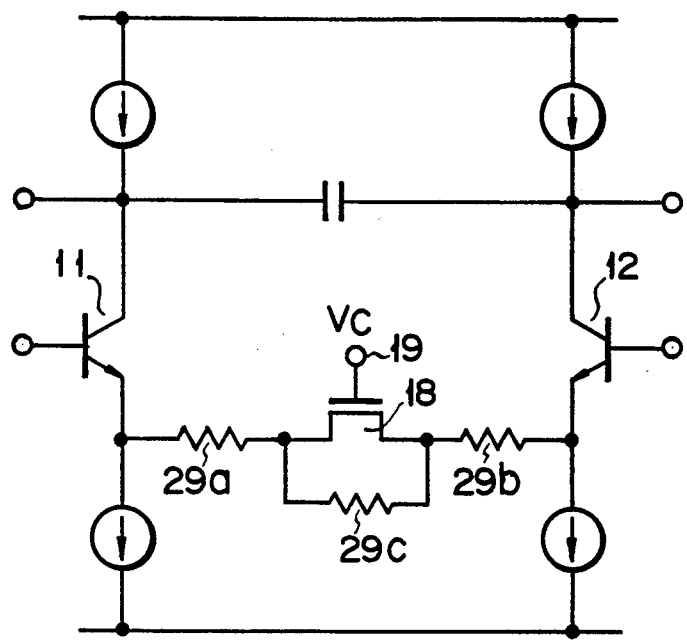
FIG. 7 is a circuit diagram showing an integration circuit constituted by a combination of the embodiments shown in FIGS. 5 and 6.

Referring to FIG. 1, a differential amplifier comprises first and second bipolar transistors (to be simply referred to as transistors hereinafter) 11 and 12, current sources 13 and 14 as loads respectively connected between the collector electrodes of the transistors 11 and 12 and a power source Vcc, and current sources 15 and 16, respectively connected to the emitter electrodes of the transistors 11 and 12 and ground GND, for determining the current value of the differential amplifier. The base electrodes of the transistors 11 and 12 are respectively connected to input terminals IN1 and IN2, while the collector electrodes of the transistors 11 and 12 are respectively connected to output terminals OUT1 and OUT2. As a load of the differential amplifier, a capacitor 17 is connected between the collector electrodes of the transistors 11 and 12, thus constituting an integration circuit.

The source and drain electrodes of a field-effect transistor (to be referred to as an FET hereinafter) 18 are connected between the emitter electrodes of the transistors 11 and 12. The gate electrode of the FET 18 is connected to a control terminal 19. The FET 18 is used as a variable-resistance element. The resistance value between the source and drain electrodes of the FET 18 is controlled by a control voltage Vc applied to its gate electrode through the control terminal 19. As the FET 18, either a MOSFET or a junction FET may be used.

An input signal is supplied to the input terminals IN1 and IN2. As a result, the collector currents of the transistors 11 and 12 are changed. Output signals corresponding to changes in collector current are extracted as differential outputs from the output terminals OUT1 and OUT2.

In the integration circuit having the above-described arrangement, the FET 18 serves as an emitter degeneration resistance of the differential amplifier. For this reason, the transconductance of the differential amplifier can be changed by changing the resistance value between the source and drain electrodes of the FET 18 by means of the control voltage Vc applied to the gate electrode of the FET 18. As a result, the time constant of the integration circuit which is determined by the transconductance of the differential amplifier and the capacitance of the capacitor 17 is changed. As described above, according to the integration circuit of the present invention, the time constant can be changed a wide range by changing the transconductance. In this case, no distortion occurs, unlike the latter conventional circuit whose time constant is changed by using the varactor diode.

In this integration circuit, since noise is not amplified unlike the former conventional circuit, the square average $\overline{Vint^2}$ of equivalent input noise voltages is equal to that in the latter conventional circuit, and noise is not increased even if the input level range, i.e., $n = gm \cdot R_E$ (where gm is the transconductance of a transistor, and $R_E$ is the resistance value between the source and drain of the FET 18) is increased.

The integration circuit of the present invention is suitable for an active filter, as will be described below. When an active filter is to be operated in a high-frequency band, a transconductance Gm of the differential amplifier must be increased to increase the cutoff frequency. For this purpose, the transconductance gm of a transistor used for the differential amplifier must be increased. In the integration circuit of the present invention, since the bipolar transistors 11 and 12 are used as amplifying elements of the differential amplifier, the transconductance Gm can be easily increased.

That is, the transconductance gm of a MOSFET used as an amplifying element of a differential amplifier is 1/10 that of bipolar transistors used as amplifying elements of a differential amplifier with the same operating current, as long as the MOSFET has normal dimensions. Therefore, in order to obtain the same transconductance gm as that of the bipolar transistor, the MOSFET requires a current about 10 times that used for the bipolar transistors. This is not desirable in consideration of current consumption and generation of heat. Hence, in consideration of application to an active filter which is operated in a high-frequency band, bipolar transistors are preferably used for a differential amplifier constituting an integration circuit.

Other embodiments of the present invention will be described below. FIGS. 2 to 6 respectively show integration circuits according to other embodiments of the present invention. The same reference numerals in FIGS. 2 to 6 denote the same parts as in FIG. 1, and only different points will be described below.

In the embodiment shown in FIG. 2, a positive feedback circuit constituted by third and fourth transistors 21 and 22 is added to the circuit shown in FIG. 1. With this arrangement, an integration circuit having an expanded linear input range can be obtained. More specifically, the collector and base electrodes of the third transistor 21 are respectively connected to the emitter electrodes of first and second transistors 11 and 12. The collector and base electrodes of the fourth transistor 22 are respectively connected to the emitter electrodes of the second and first transistors 12 and 11. Current sources 15 and 16 for determining the current value of the differential amplifier are respectively connected between the emitter electrodes of the transistors 21 and 22 and ground GND. In this embodiment, the source and drain electrodes of an FET 18 are connected between the emitter electrodes of the transistors 21 and 22. It is known that the non-linearity of the voltage-current characteristics of bipolar transistors can be improved by arranging a positive feedback circuit constituted by the third and fourth transistors 21 and 22.

In the embodiment shown in FIG. 3, an FET 23 for changing a DC gain is used as a load of a differential amplifier and its source and drain electrodes are connected to the collector electrodes of transistors 11 and 12, respectively. The gate electrode of the FET 23 is connected to a control terminal 24. The resistance value between the source and drain electrodes of the FET 23 is changed by changing a control voltage to be applied to the control terminal 24, thereby changing the DC gain. With this operation, low-frequency poles are changed to compensate for an undesired phase delay of a high-frequency component. This technique is also disclosed in, e.g., "High frequency CMOS continuous-time filter" described hereinabove.

In the embodiment shown in FIG. 4, the embodiments shown in FIGS. 2 and 3 are combined to obtain the effects of the two embodiments. More specifically, current sources 15 and 16 for determining the current value of a differential amplifier are respectively connected between the emitter electrodes of transistors 21 and 22 and ground GND. The source and drain electrodes of an FET 23 for changing a DC gain are connected to the collector electrodes of transistors 11 and 12, respectively. With this arrangement, the nonlinearity of the voltage-current characteristics of bipolar transistors can be improved, and the DC gain can be controlled.

In the above embodiments, output signals are extracted from the two output terminals OUT1 and OUT2 as differential outputs, i.e., balanced outputs. However, one of the current sources 13 and 14 (e.g., 13) as loads connected to the collectors of the transistors 11 and 12 may be omitted, and the collector of the transistor 11 may be directly connected to the power source Vcc so as to extract output signals from a portion between the collector of the transistor 12 and the ground GND as unbalanced outputs. In addition, a current mirror circuit may be used as a load of the transistors 11 and 12 in the differential amplifier. In the embodiment shown in FIG. 5, resistors 29a and 29b are respectively connected between the two ends of the FET 23 and the emitters of the transistors 11 and 12 in the circuit shown in FIG. 1. With this arrangement, the influences of the nonlinearity of the FET 23 can be reduced, and the distortion of outputs from the output terminals OUT1 and OUT2 can be reduced.

In the embodiment shown in FIG. 6, a resistor 29 is connected in parallel with the FET 23 in the circuit shown in FIG. 1. Similar to the embodiment shown in FIG. 5, in this embodiment, the influences of the nonlinearity of the FET 23 on the output terminals OUT1 and OUT 2 are suppressed to reduce the distortion of outputs. Furthermore, in the circuit shown in FIG. 6, even if the resistance value between the source and drain electrodes of an FET 18 is increased by a voltage Vc applied to a gate terminal 19 of the FET 18, the lower limit of the time constant of the integration circuit can be set by the resistance value of the resistor 29.

The embodiment shown in FIG. 7 is constituted by a combination of the embodiments shown in FIGS. 5 and 6. More specifically, resistors 29a and 29b are respectively connected between the two ends of an FET 18 and the emitters of transistors 11 and 12, and a resistor 29c is connected in parallel with the FET 18. In this embodiment, the upper and lower limits of the time constant of the integration circuit can be set to be desirable values.

Figure 8:
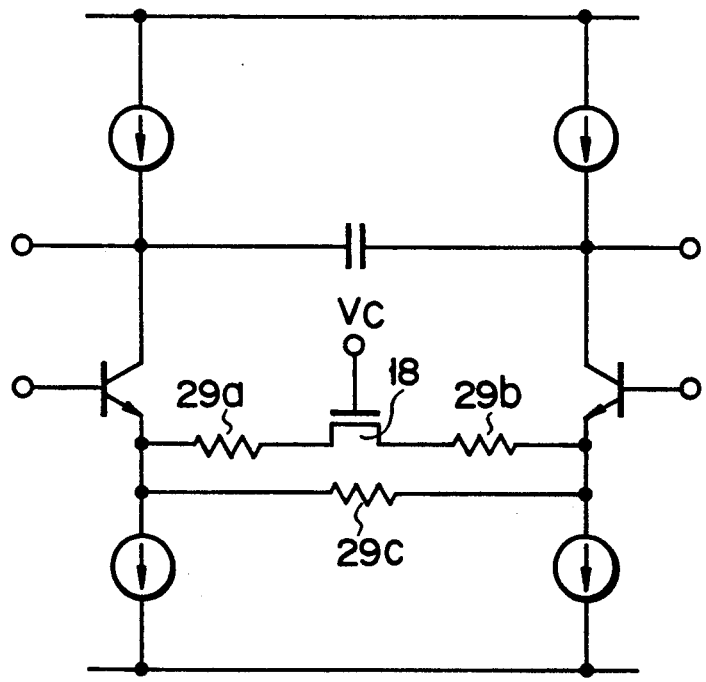
FIG. 8 is a circuit diagram showing an integration circuit as a modification of the circuit shown in FIG. 7.

In the embodiment shown in FIG. 8, an upper limit setting resistor 29c is connected in parallel with a series circuit including a resistor 29a, an FET 18, and a resistor 29b. In this embodiment, the upper and lower limits of the time constant of the integration circuit can be set to be desired values.

According to the embodiments shown in FIGS. 7 and 8, since the upper and lower limits of the time constant can be determined, a locking operation of a PLL, i.e., a response to variations in input can be easily obtained.

In the embodiment shown in FIG. 9, a plurality of resistors R1 to Rn are connected in series between the emitters of transistors 11 and 12, and FETs 18l to 18n are respectively connected in parallel with these resistors. According to this embodiment, the FETs are not used as analog resistive elements but used to switch resistances for determining the time constant of the integration circuit. That is, the time constant is controlled in a digital manner.

In the embodiment shown in FIG. 10, a differential amplifier comprises first and second field-effect transistors, i.e., FETs 11' and 12', current sources 13 and 14 serving as loads and connected between the source (drain) electrodes of the FETs 11' and 12' and a power source Vcc, and current sources 15 and 16, connected between the drain (source) electrodes of the FETs 11' and 12' and ground GND, for determining the current value of the differential amplifier. The gate electrodes of the FETS 11' and 12' are respectively connected to input terminals IN1 and IN2, while their source (drain) electrodes are respectively connected to output terminals OUT1 and OUT2. Resistors 29a and 29b are respectively connected between the two ends of the FET 18 and the emitters of the FETs 11' and 12'. According to this embodiment, similar to the embodiment shown in FIG. 7, the linearity of the integration circuit is improved by the resistors 29a and 29b, and a locking operation of a PLL is facilitated.

In the embodiment shown in FIG. 11, the linearity of the integration circuit is improved by connecting two differential amplifiers in such a manner that their output currents have opposite phases. More specifically, a differential amplifier OP1 constituted by FETs 11', 12', and 18' and resistors 29a and 29b, and a differential amplifier OP2 constituted by FETs 11", 12", and 18" and resistors 29d and 29e are respectively connected to current sources 13 and 14 in such a manner that their outputs have opposite phases.

In this embodiments, with the resistors 29a, 29b, 29d, and 29e, the linearity of the integration circuit is further improved as compared with an integration circuit without these resistors, and a locking operation of a PLL is facilitated.

The embodiment shown in FIG. 12 employs, as a linear element, a circuit disclosed in "FLOATING VOLTAGE-CONTROLLED RESISTORS IN CMOS TECHNOLOGY", IEE ELECTRONICS LETTERS 22nd, July 1982, Vol. 18, No. 15, pp. 678-679. That is, the circuit disclosed in this reference is connected between the emitters of the bipolar transistors 11 and 12 in place of the FET 18 of the integration circuit shown in FIG. 1. The circuit comprises two serial FET circuits connected between the Vcc and GND lines, one serial FET circuit including field effect transistors FET1 and FET3, and the other field effect transistors FET2 and FET4. The gates of FET1 and FET2 are connected respectively to the drain and source of FETs 18a and the source and drain of FET 18b, and the emitters of the bipolar transistors 11 and 12. The gates of FETs 18a and 18b are connected to the sources of FET1 and FET2, respectively. The gates of the FET3 and FET4 are connected to each other and connected to the GND line via a voltage adjuster VAJ.

According to this embodiment, since the circuit arranged in place of the FET 18 serves as a linear resistor, the linearity of the integration circuit is further improved as compared with the integration circuit using the single FET 18 in the embodiment shown in FIG. 1. In this embodiment, the resistance value can be controlled by changing, by means of the voltage adjuster VAJ, a potential to be applied to a line 19.

FIG. 13 shows an integration circuit obtained by adding resistors 29a and 29b to the integration circuit shown in FIG. 12. That is, the resistors 29a and 29b are connected respectively between the emitters of the transistors 11 and 12 and the source and drain of FET 18a. According to this integration circuit, a voltage applied between the source and drain electrodes of an FET is decreased so that FETs 18a and 18b can be operated in a region more linear than that in the embodiment shown in FIG. 12.

Applications of the integration circuit of the present invention will be described below.

FIG. 14 shows an embodiment of a quadratic active filter having a full differential arrangement constituted by the integration circuit of the present invention. This active filter comprises voltage controlled current sources (also called transconductance amplifiers) 30 to 33 and capacitors 34 to 39. The voltage controlled current sources 31 to 33 are cascade-connected to each other. The output side of the voltage controlled current source 33 is connected to an output port P0 and is fed back to the input side of the voltage controlled current source 31. The capacitors 34 and 35 are respectively connected, as loads, to the output sides of the voltage controlled current sources 31 and 32. The input side of the voltage control current source 30 is connected to a port P1, while its output side is connected to the input side of the voltage controlled current source 32. A port P2 is connected to the input side of the voltage controlled current source 32 through the capacitors 36 and 37. A port P3 is connected to the input side of the voltage controlled current source 33 through the capacitors 38 and 39.

Figure 15:
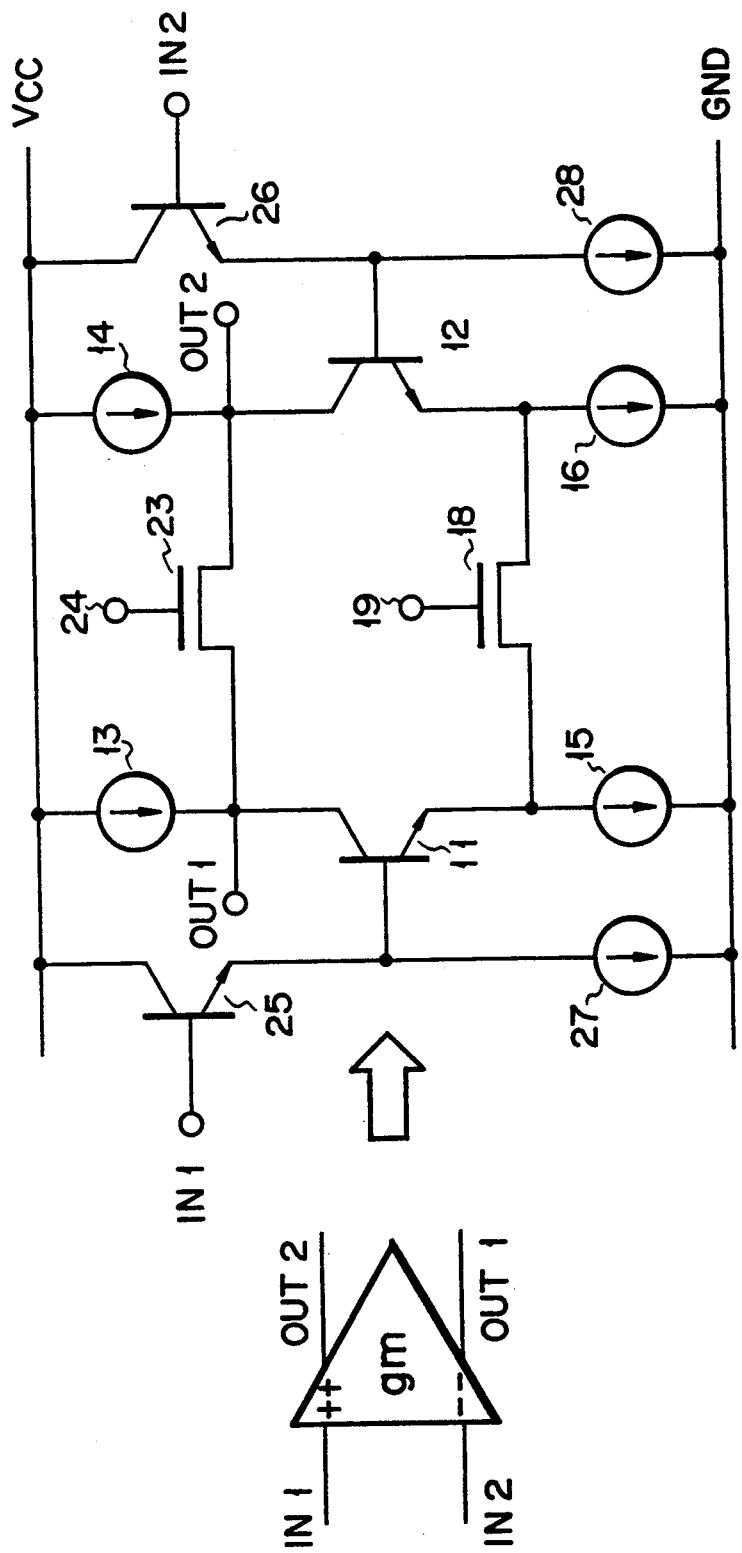
FIG. 15 is a circuit diagram showing a voltage controlled current source in the circuit shown in FIG. 14.

Each of the voltage controlled current sources 30 to 33 has a circuit arrangement shown in, e.g., FIG. 15. The arrangement of the circuit shown in FIG. 15 is equivalent to that of the integration circuit shown in FIG. 3 from which the capacitor 17 as a load is omitted. In this circuit, emitter followers as buffers constituted by transistors 25 and 26 and current sources 27 and 28 as emitter loads thereof are respectively connected between input terminals IN1 and IN2 and the base electrodes of transistors 11 and 12. The capacitors 34 and 35 in FIG. 14 correspond to a capacitor 17, and integration circuits are respectively constituted by pairs of the voltage controlled current source 31 and the capacitor 34, and the voltage controlled current source 32 and the capacitor 35. Note that the voltage controlled current source 33 serves as a termination resistor.

If an output signal to the output port P0 is represented by $V_0$; input signals to the input ports P1 to P3, $V_1$ to $V_3$; the capacitances of the capacitors 34, 35, 36 (37), and 38 (39), $C_1$ to $C_4$; and the transconductance of a transistor, gm, the transfer function of this active filter is given by $$V_0 = [V_3 S_2(C_1 + C_4)C_3 - V_2 SC_4 gm + \quad (6)$$

$$V_1 gm_2]/[S_2(C_1 + C_4)(C_2 + C_3) + S(C_1 + C_4)gm + gm_2]$$

As is apparent from this equation, when the signal $V_1$ is input to the port P1 ($V_2$ and $V_3$ are 0), the active filter serves as a low-pass filter. When the signal $V_2$ is input to the port P2 ($V_1$ and $V_2$ are 0), the active filter serves as a band-pass filter. When the signal $V_3$ is input to the port P3 ($V_1$ and $V_2$ are 0), the active filter serves as a high-pass filter. Note that in each filter mode, the input ports which receive no signals are grounded in an AC manner.

Figure 16:
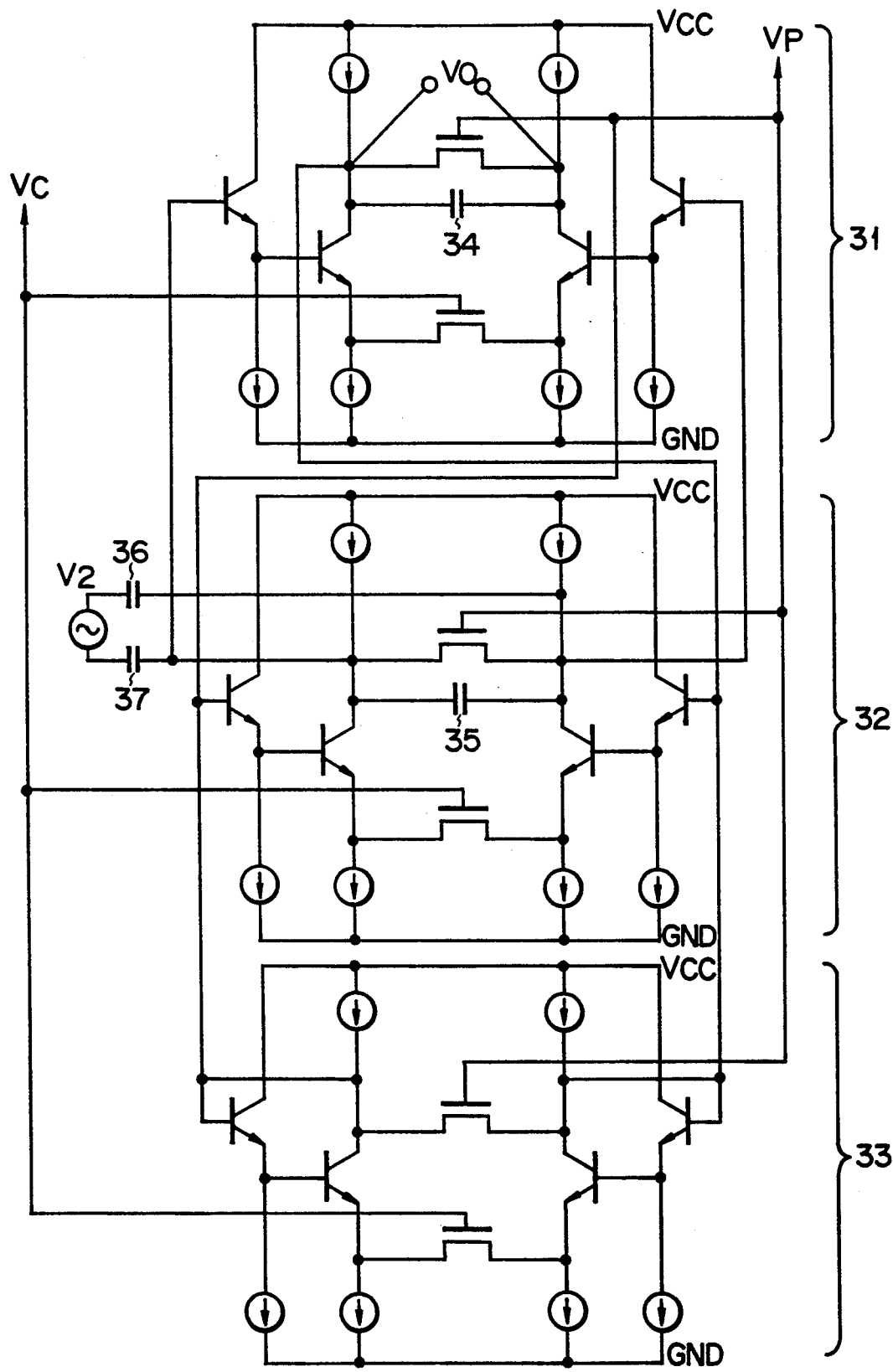
FIG. 16 is a circuit diagram showing a detailed arrangement of an active filter in FIG. 15.

FIG. 16 shows a circuit in which only a portion associated with the band-pass filter of the active filter in FIG. 14 is embodied to the transistor level by using the voltage controlled current sources shown in FIG. 15. By changing the resistance value between the source and drain electrodes of the FET 18 in FIG. 15 using the control voltage Vc, the center frequency (fo) of the band-pass filter can be controlled. In addition, if the phase characteristics of the band-pass filter are controlled by changing the resistance value between the source and drain electrodes of the FET 23 in FIG. 15 using a control voltage Vp, an undesired phase delay of a high-frequency component can be compensated.

FIGS. 14 and 15 show the balanced active filter. However, the present invention can be applied to an unbalanced active filter, as shown in FIG. 17. FIG. 17 shows an unbalanced quadratic active filter. In this active filter, two unbalanced voltage controlled current sources 41 and 42 are cascade-connected to each other, while the noninverting input terminal of the voltage controlled current source 41 and the output terminal of the voltage controlled current source 42 are respectively connected to an input port P1 and an output port P0. In addition, the output terminals of the voltage controlled current sources 41 and 42 are respectively connected to input ports P2 and P3 through capacitors 43 and 44. The output terminal of the voltage controlled current source 42 is negatively fed back to the inverting input terminals of the voltage controlled current sources 41 and 42 through feedback elements 45 and 46.

Figure 18A:
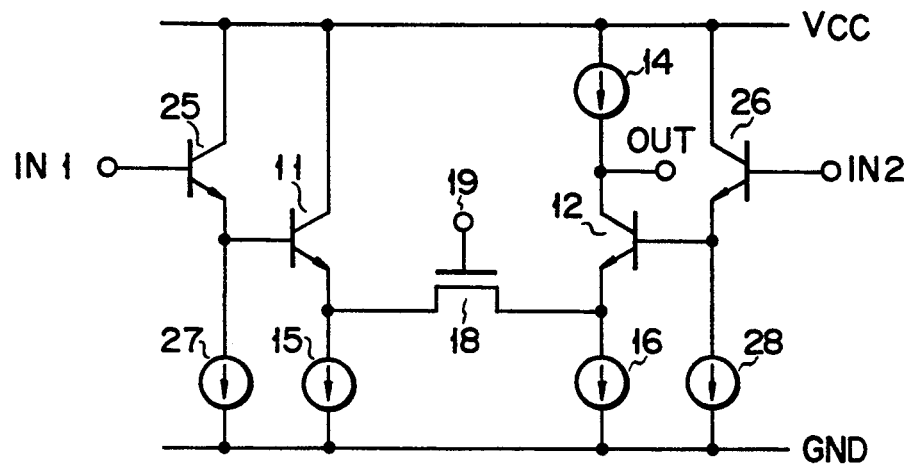
FIGS. 18A and 18B are circuit diagrams showing a voltage controlled current source in FIG. 14.
Figure 18B:
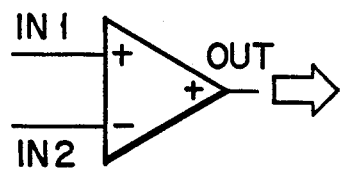
Figure 18B:
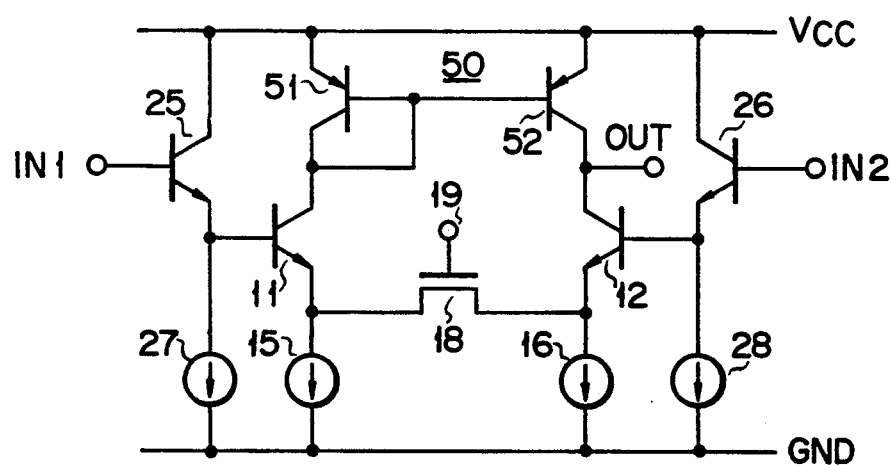

Each of the voltage controlled current sources 41 and 42 has an arrangement shown in FIGS. 18A or 18B, which is basically equivalent to a circuit obtained by modifying the voltage controlled current source shown in FIG. 6 into an unbalanced type. Referring to FIG. 18A, the current source 13 in FIG. 6 is omitted, so that the collector of a transistor 11 is directly connected to a power source Vcc, and the collector of a transistor 12 is connected to an output terminal OUT. The emitter followers constituted by transistors 25 and 26 and current sources 27 and 28 are respectively connected between input terminals IN1 and IN2 and the base electrodes of transistors 11 and 12. Referring to FIG. 18B, the load elements of the transistors 11 and 12 in FIG. 6 are replaced with a current mirror circuit constituted by transistors 51 and 52. In these cases, one end of each of capacitors (e.g., the capacitors 43 and 44 in FIG. 17) for constituting an integration circuit is connected to the output terminal OUT.

If an output signal to the output port P0 is represented by $V_0$; input signals to the input ports $P_1$ to $P_3$, $V_1$ to $V_3$; the capacitances of the capacitors 43 and 44, $C_1$ and $C_2$; the feedback coefficients of the feedback elements 45 and 46, $m_0$ and $m_1$; and the transconductance of a transistor, gm, the transfer function of the active filter is given by $$V_0 = \frac{V_2 S^2 + \frac{gm}{C_2} V_1 S + \frac{gm^2}{C_1 C_2}}{S^2 + \frac{gm \cdot m_1}{C^2} S + \frac{gm^2 \cdot m_0}{C_1 \cdot C_2}}$$

Similar to the active filter in FIG. 7, therefore, this active filter serves as a low-pass filter when the signal $V_1$ is input to the port $P_1$ ($V_2$ and $V_3$ are 0). When the signal $V_2$ is input to the port P2 ($V_1$ and $V_3$ are 0), the active filter serves as a band-pass filter. When the signal $V_3$ is input to the port P3 ($V_1$ and $V_2$ are 0), the active filter serves as a high-pass filter.

FIG. 19 shows an unbalanced linear active filter. In this active filter, the noninverting input terminal of a voltage controlled current source 61 is connected to an input port P1. The output terminal of the voltage controlled current source 61 is connected to an output port P0 and is also connected to an input port P2 through a capacitor 62. In addition, the output terminal of the voltage controlled current source 61 is fed back to its inverting input terminal. The voltage controlled current source 61 has an arrangement equivalent to that shown in FIGS. 18A or 18B. When a signal is input to the input port P1, this active filter serves as a low-pass filter. When a signal is input to the input port P2, the active filter serves as a high-pass filter.

Figure 21:
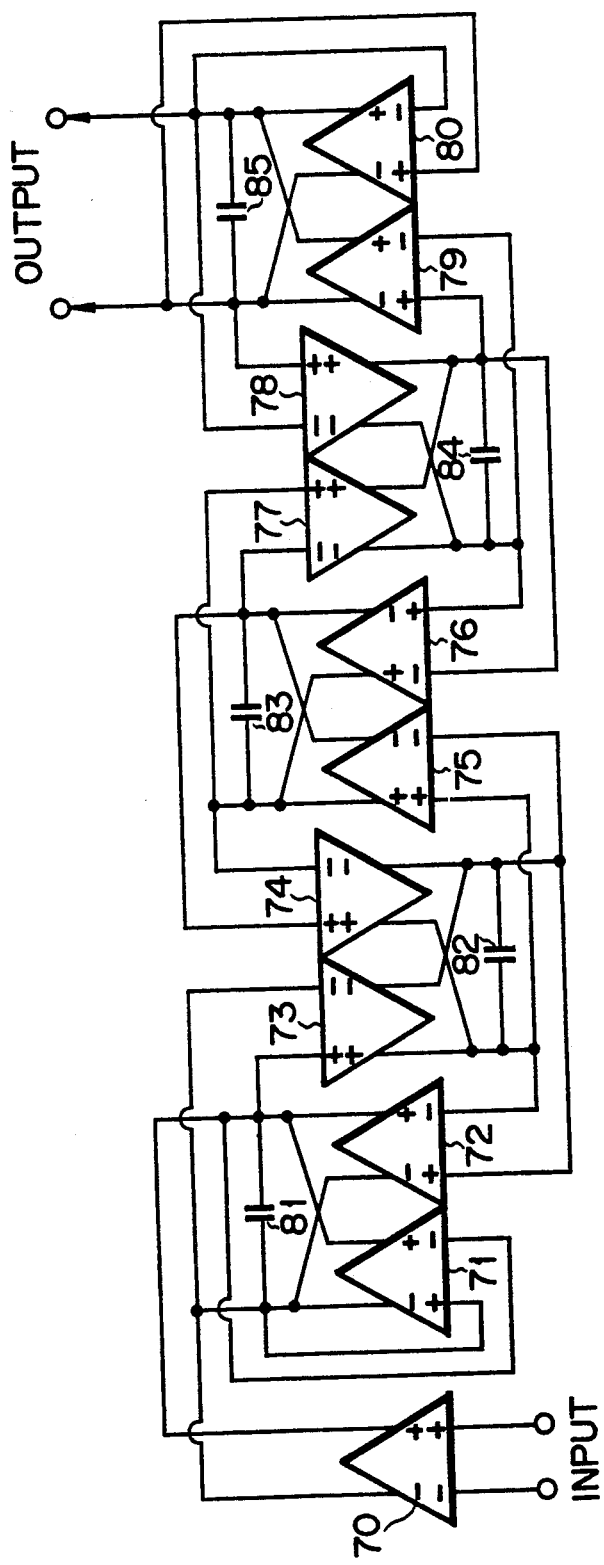
FIG. 21 is a circuit diagram showing the low-pass filter in FIG. 20 which is constituted by the integration circuit of the present invention.

FIG. 20 shows a lattice type quintic low-pass filter constituted by an LC. FIG. 21 shows an active filter having a full differential arrangement based on a signal flow graph obtained from the circuit in FIG. 20. Voltage controlled current sources 70 to 80 in FIG. 21 correspond to, e.g., the voltage controlled current sources shown in FIG. 15. These voltage controlled current sources are combined with capacitors 81 to 85 constituting integration circuits.

Figure 22:
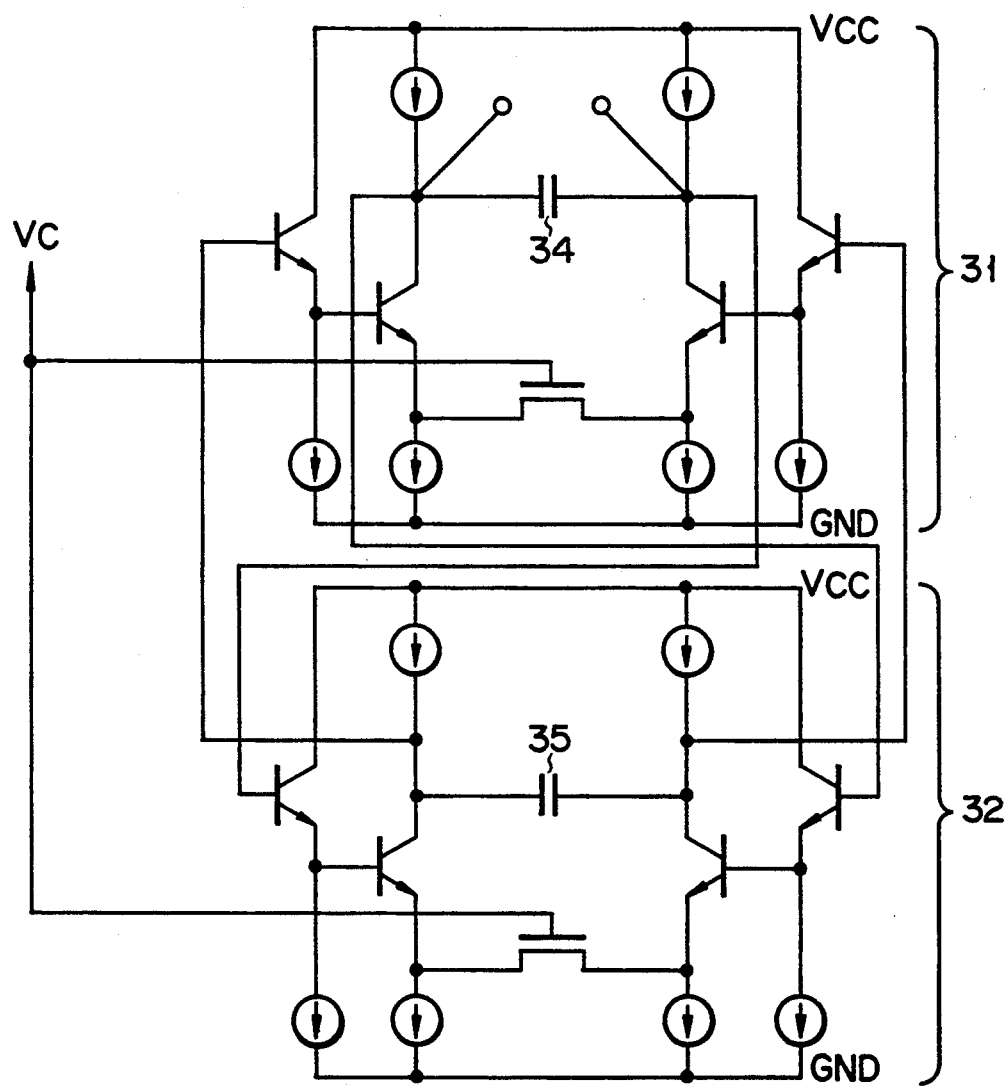
FIG. 22 is a circuit diagram showing a voltage controlled oscillator using the integration circuit of the present invention.

The above-described applications are associated with active filters. However, the integration circuit of the present invention can be applied to other devices, e.g., a voltage controlled oscillator (VCO). FIG. 22 shows such an example, which is basically designed such that the voltage controlled current source 33 used as a termination resistor in the active filter shown in FIG. 16 is omitted to allow an oscillating operation. In this case, when the control voltage Vc to be applied to the FET 18 in FIG. 15 is changed, the time constant of each integration circuit is changed, and the oscillation frequency of the oscillator is changed, thus allowing the oscillator to operate as a VCO.

In addition, an FM modulator or the like can be realized by using this VCO.

According to the integration circuit of the present invention, the time constant can be changed by changing the transconductance of the differential amplifier while a high S/N ratio can be maintained. Therefore, the integration circuit is suitable for an active filter or a VCO which is used in high-frequency bands.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An integration circuit comprising:
   a differential amplifier including at least first and second bipolar transistors having emitter electrodes and serving as amplifying elements;
   a capacitor serving as a load of said differential amplifier;
   a control terminal to which a control voltage is applied;
   a field-effect transistor having source and drain electrodes respectively connected to the emitter electrodes of said first and second bipolar transistors, and a gate electrode connected to said control terminal; and
   a positive feedback circuit constituted by a third transistor having collector and base electrodes respectively connected to the emitter electrodes of said first and second bipolar transistors, and a fourth transistor having collector and base electrodes respectively connected to the emitter electrodes of said second and first bipolar transistors.

2. An integration circuit comprising:
   a differential amplifier including at least first and second bipolar transistors having emitter electrodes and serving as amplifying elements;
   a capacitor serving as a load of said differential amplifier;
   a control terminal to which a control voltage is applied;
   a field-effect transistor having source and drain electrodes respectively connected to the emitter electrodes of said first and second bipolar transistors, and a gate electrode connected to said control terminal; and
   a second field-effect transistor, having source and drain electrodes respectively connected to collector electrodes of said first and second bipolar transistors, and a gate electrode to which a control voltage is applied, for controlling a DC gain of said integration circuit.

3. An integration circuit comprising:
   a differential amplifier including at least first and second bipolar transistors having emitter electrodes and serving as amplifying elements;
   a capacitor serving as a load of said differential amplifier;
   a control terminal to which a control voltage is applied;
   a field-effect transistor having source and drain electrodes respectively connected to the emitter electrodes of said first and second bipolar transistors, and a gate electrode connected to said control terminal; and
   a positive feedback circuit constituted by a third transistor having collector and base electrodes respectively connected to the emitter electrodes of said first and second bipolar transistors, a fourth transistor having collector and base electrodes respectively connected to the emitter electrodes of said second and first bipolar transistors, and a DC gain control circuit constituted by a second field-effect transistor having source and drain electrodes respectively connected to collector electrodes of said first and second bipolar transistors, and a gate electrode to which a control voltage is applied.

4. An integration circuit comprising:
a differential amplifier including at least first and second bipolar transistors having emitter electrodes and serving as amplifying elements;
a capacitor serving as a load of said differential amplifier;
a control terminal to which a control voltage is applied;
a field-effect transistor having source and drain electrodes respectively connected to the emitter electrodes of said first and second bipolar transistors, and a gate electrode connected to said control terminal; and
a fixed resistor connected in parallel with the source and drain electrodes of said field-effect transistor.

5. An integration circuit comprising:
a differential amplifier including at least first and second bipolar transistors having emitter electrodes and serving as amplifying elements;
a capacitor serving as a load of said differential amplifier;
a control terminal to which a control voltage is applied;
a field-effect transistor having source and drain electrodes respectively connected to the emitter electrodes of said first and second bipolar transistors, and a gate electrode connected to said control terminal; and
a first fixed resistor series-connected between the source electrode of said field-effect transistor and the emitter electrode of said field-effect transistor and the emitter electrode of said bipolar transistor, and a second fixed resistor series-connected between the drain electrode of said field-effect transistor and the emitter electrode of said bipolar transistor.

6. A circuit according to claim 5, further comprising a third fixed resistor connected in parallel with the source and drain electrodes of said field-effect transistor.

7. A circuit according to claim 5, further comprising a third fixed resistor connected in parallel with a series circuit constituted by said field-effect transistor and said first and second fixed resistors.

8. An integration circuit comprising:
a differential amplifier including at least first and second bipolar transistors having emitter electrodes and serving as amplifying elements;
a capacitor serving as a load of said differential amplifier;
a control terminal to which a control voltage is applied;
a field-effect transistor having source and drain electrodes respectively connected to the emitter electrodes of said first and second bipolar transistors, and a gate electrode connected to said control terminal; and
emitter followers connected respectively between two input terminals and base electrodes of said first and second bipolar transistors, and an output terminal connected to a collector of said second bipolar transistor.

9. An integration circuit comprising:
a differential amplifier including at least first and second bipolar transistors having emitter electrodes and serving as amplifying elements;
a capacitor serving as a load of said differential amplifier;
a control terminal to which a control voltage is applied; and
an impedance changing circuit network connected between the emitter electrodes of said first and second bipolar transistors and constituted by at least a field-effect transistor having a gate electrode connected to the control terminal and a resistor connected to the field-effect transistor.

10. A circuit according to claim 9, wherein said impedance changing circuit network is constituted by a plurality of series-connected impedance changing circuits, and each of said impedance changing circuits is constituted by a field-effect transistor and a resistor parallel-connected between source and drain electrodes of said field-effect transistor.

11. An integration circuit comprising:
a differential amplifier including first, second, third, and fourth bipolar transistors serving as amplifying elements, said first and second bipolar transistors having base electrodes as input terminals, a collector electrode of at least one of said first and second bipolar transistors serving as an output terminal, said third bipolar transistor having collector and base electrodes respectively connected to emitter electrodes of said first and second bipolar transistors, and said fourth bipolar transistor having collector and base electrodes respectively connected to the emitter electrodes of said second and first bipolar transistors;
a capacitor connected, as a load, to said differential amplifier; and
a field-effect transistor having source and drain electrodes respectively connected to emitter electrodes of said third and fourth transistors, and a gate electrode to which a control voltage is applied.

12. An integration circuit comprising:
a differential amplifier including at least first and second field-effect transistors having source and drain electrodes and serving as amplifying elements;
a capacitor connected, as a load, to said differential amplifier; and
an impedance changing circuit network connected between the source electrodes of said first and second field-effect transistors and including at least a third field-effect transistor having source and drain electrodes, and a resistor;
wherein said impedance changing circuit network includes a first fixed resistor series-connected between the source electrode of said first field-effect transistor and the source electrode of said third field-effect transistor, and a second fixed resistor series-connected between the source electrode of said second field-effect transistor and the drain electrode of said third field-effect transistor.

13. An integration circuit comprising:
a differential amplifier including at least first and second field-effect transistors having source and drain electrodes and serving as amplifying elements;

a capacitor connected, as a load, to said differential amplifier; and an impedance changing circuit network connected between the source electrodes of said first and second field-effect transistors and including at least a third field-effect transistor having source and drain electrodes, and a resistor;

wherein said impedance changing circuit network includes a fixed resistor connected between the source and drain electrodes of said third field-effect transistor.

14. An integration circuit comprising:

a first differential amplifier constituted by at least first and second field-effect transistors having source and drain electrodes and serving as amplifying elements;

a second differential amplifier, constituted by third and fourth field-effect transistors having source and drain electrodes and serving as amplifying elements, for outputting an output having a phase opposite to that of an output from said first differential amplifier;

a capacitor connected, as a load, to said first and second differential amplifiers;

a first impedance changing circuit network including at least a fifth field-effect transistor and resistors which are connected between the source electrodes of said first and second field-effect transistors; and a second impedance changing circuit network including at least a sixth field-effect transistor and resistors which are connected between the source electrodes of said third and fourth field-effect transistors.

* * * * *